(12) United States Patent
Sakamoto et al.

(10) Patent No.: US 12,509,557 B2
(45) Date of Patent: Dec. 30, 2025

(54) THERMALLY CONDUCTIVE POLYSILOXANE COMPOSITIONS

(71) Applicant: MOMENTIVE PERFORMANCE MATERIALS JAPAN LLC, Tokyo (JP)

(72) Inventors: Atsushi Sakamoto, Tokyo (JP); Sean Conte, Tokyo (JP)

(73) Assignee: MOMENTIVE PERFORMANCE MATERIALS JAPAN LLC, Tokyo (JP)

( * ) Notice: Subject to any disclaimer, the term of this patent is extended or adjusted under 35 U.S.C. 154(b) by 847 days.

(21) Appl. No.: 17/622,273

(22) PCT Filed: Jun. 24, 2020

(86) PCT No.: PCT/JP2020/024767
§ 371 (c)(1),
(2) Date: Dec. 23, 2021

(87) PCT Pub. No.: WO2020/262449
PCT Pub. Date: Dec. 30, 2020

(65) Prior Publication Data
US 2022/0267533 A1    Aug. 25, 2022

(30) Foreign Application Priority Data
Jun. 26, 2019    (JP) .................. 2019-119025

(51) Int. Cl.
*C08G 77/20* (2006.01)
*B01J 23/42* (2006.01)
*C08K 3/28* (2006.01)

(52) U.S. Cl.
CPC .............. *C08G 77/20* (2013.01); *B01J 23/42* (2013.01); *C08K 3/28* (2013.01); *C08K 2003/282* (2013.01); *C08K 2201/001* (2013.01); *C08K 2201/003* (2013.01)

(58) Field of Classification Search
CPC . C08G 77/20; B01J 23/42; C08K 3/28; C08K 2003/282; C08K 2201/001; C08K 2201/003; H01L 23/49568; H01L 23/3737; H01L 23/3735; H01L 23/3121; H01L 23/0655; H01L 2224/32245; H01L 2224/48091; H01L 2224/48106; H01L 2224/48245; H01L 2224/48137; H01L 2224/29139; H01L 2224/0665; H01L 2224/73265; H01L 24/32
See application file for complete search history.

(56) References Cited

U.S. PATENT DOCUMENTS

| | | | |
|---|---|---|---|
| 11,142,644 B2 | 10/2021 | Hirakawa et al. | |
| 2018/0134938 A1* | 5/2018 | Hirakawa | C08L 83/04 |
| 2019/0292349 A1* | 9/2019 | Ito | C09K 5/10 |
| 2020/0140736 A1 | 5/2020 | Takenaka et al. | |
| 2020/0157350 A1* | 5/2020 | Sakamoto | C08K 3/22 |
| 2021/0147681 A1 | 5/2021 | Hirakawa et al. | |
| 2021/0147738 A1* | 5/2021 | Takanashi | C08G 77/08 |

FOREIGN PATENT DOCUMENTS

| | | |
|---|---|---|
| JP | 2002003831 A | 1/2002 |
| JP | 2007191537 A | 8/2007 |
| JP | 2009096961 A | 5/2009 |
| JP | 2013147600 A | 8/2013 |
| WO | 2016190189 A1 | 12/2016 |
| WO | 2018016564 A1 | 1/2018 |
| WO | 2018016566 A1 | 1/2018 |
| WO | 2018221662 A1 | 12/2018 |

OTHER PUBLICATIONS

International Search Report (ISR) (and English language translation thereof) dated Sep. 15, 2020, issued in International Application No. PCT/JP2020/024767.
Written Opinion dated Sep. 15, 2020, issued in International Application No. PCT/JP2020/024767.

* cited by examiner

*Primary Examiner* — Shane Fang
(74) *Attorney, Agent, or Firm* — Holtz, Holtz & Volek PC

(57) ABSTRACT

A thermally conductive polysiloxane composition includes (A) a thermally conductive filler and (B) one or more compounds selected from an alkoxysilyl group-containing compound and a dimethylpolysiloxane, wherein: component (A) includes (A-1) round, indefinite-shaped or polyhedral aluminum nitride particles having an average particle diameter of from 50 μm to 150 μm and (A-2) round, indefinite-shaped or polyhedral aluminum nitride particles having an average particle diameter of 10 μm or more but less than 50 μm in an amount of from 20% by mass to 100% by mass relative to the total amount of component (A); and the content ratio of component (A-1) to component (A-2) is from 50:50 to 95:5 on a mass basis.

9 Claims, No Drawings

THERMALLY CONDUCTIVE POLYSILOXANE COMPOSITIONS

TECHNICAL FIELD

The present invention relates to thermally conductive polysiloxane compositions.

BACKGROUND ART

Electronic devices year after year become higher in the integration and speed, and, according to this, the demand for heat dissipation materials for solving heat problems is increasing. In heat dissipation materials, silicone resin compositions are widely used. A silicone resin cannot enhance the thermal conductivity by itself, and therefore a thermally conductive filler and the silicone resin are used in combination. It has been known that, as a thermally conductive filler, a material having a higher thermal conductivity than that of a silicone resin as a binder, such as a silica powder, alumina, boron nitride, aluminum nitride or magnesium oxide, is added (Patent Literature 1).

For increasing the thermal conductivity of the silicone resin composition, it is necessary to fill the composition with a thermally conductive filler at a higher filling ratio, but increasing the filling ratio using only a single type of a thermally conductive filler has a limitation, and therefore the use of a plurality of thermally conductive fillers having different particle diameters in combination has been attempted. For example, for the purpose of achieving good fluidity for working properties and excellent heat dissipation performance, a thermally conductive silicone grease composition containing a thermally conductive filler having an average particle diameter of 12 to 100 μm (preferably 15 to 30 μm) and a thermally conductive filler having an average particle diameter of 0.1 to 10 μm (preferably 0.3 to 5 μm) has been disclosed (Patent Literature 2). Further, a thermally conductive silicone composition of an addition reaction type made by blending in a specific ratio an indefinite-shaped alumina having an average particle diameter of 10 to 30 μm, a spherical-shaped alumina having an average particle diameter of 30 to 85 μm, and an insulating inorganic filler having an average particle diameter of 0.1 to 6 μm has been disclosed (Patent Literature 3). Furthermore, for the purpose of achieving good working properties due to a low viscosity and improving thermally conductivity, a thermally conductive polysiloxane composition that contains in a specific ratio indefinite-shaped aluminum nitride particles having an average particle diameter of not less than 30 μm and not more than 150 μm, inorganic particles having an average particle diameter of not less than 1 μm and less than 30 μm, and inorganic particles having an average particle diameter of not less than 0.1 μm and less than 1 μm has been disclosed (Patent Literature 4).

CITATION LIST

Patent Literature

Patent Literature 1: JP 2002-003831 A
Patent Literature 2: JP 2009-096961 A
Patent Literature 3: JP 2013-147600 A
Patent Literature 4: WO 2018/016566 A1

SUMMARY OF INVENTION

Technical Problem

Unfortunately, the silicone compositions of Patent Literatures 2 and 3 exhibited an increased viscosity and poor workability when filled with the thermally conductive fillers at a higher filling ratio. Sufficient thermal conductive properties were not obtained when the silicone compositions of Patent Literatures 2 and 3 were filled with increased amounts of the thermally conductive fillers while avoiding a decrease in workability.

On the other hand, higher dispensability of thermally conductive polysiloxane compositions is desired from the point of view of working efficiency. While the polysiloxane composition of Patent Literature 4 attained excellent workability due to a low viscosity and thermal conductive properties, the dispensability of the composition was insufficient.

Accordingly, the problem to be solved by the present invention is to provide a thermally conductive polysiloxane composition having high dispensability to offer excellent working efficiency and also having high thermal conductive properties, and to provide a heat dissipation material including the composition.

Solution to Problem

A summary of the present invention is as follows.
(1) A thermally conductive polysiloxane composition containing (A) a thermally conductive filler, and (B) at least one member selected from the group consisting of an alkoxysilyl group-containing compound and a dimethylpolysiloxane, the component (A) comprising, based on the total mass of the component (A), 20 to 100 mass % of (A-1) round, indefinite-shaped or polyhedral aluminum nitride particles having an average particle diameter of not less than 50 μm and not more than 150 μm and (A-2) round, indefinite-shaped or polyhedral aluminum nitride particles having an average particle diameter of not less than 10 μm and less than 50 μm, the content ratio of the component (A-1) to the component (A-2) on a mass basis being 50:50 to 95:5.
(2) The thermally conductive polysiloxane composition described in (1), wherein the component (A-2) has an oil absorption of 5 to 40 g/100 g as measured by a boiled linseed oil method in accordance with JIS K5101-13-2.
(3) The thermally conductive polysiloxane composition described in (1) or (2), wherein the component (A) further comprises, based on the total mass of the component (A), 1 to 80 mass % of (A-3) inorganic particles having an average particle diameter of not less than 0.1 μm and less than 10 μm, and the total of the components (A-1) to (A-3) represents 80 to 100 mass % of the total mass of the component (A).
(4) The thermally conductive polysiloxane composition described in (3), wherein the component (A-3) comprises (A-3a) inorganic particles having an average particle diameter of not less than 1 μm and less than 10 μm and (A-3b) inorganic particles having an average particle diameter of not less than 0.1 μm and less than 1 μm, and the component (A) includes 1 to 50 mass % of the component (A-3a) and 1 to 50 mass % of the component (A-3b) based on the total mass of the component (A).
(5) The thermally conductive polysiloxane composition described in (4), wherein the component (A) includes, based on the total mass of the component (A), 20 to 60 mass % of the component (A-1), 2 to 25 mass % of the component (A-2), 1 to 40 mass % of the component (A-3a) and 1 to 30 mass % of the component (A-3b).
(6) The thermally conductive polysiloxane composition described in (4) or (5), wherein the inorganic particles of the components (A-3a) and (A-3b) are at least one member selected from the group consisting of silicon nitride particles, aluminum nitride particles and alumina particles, respectively.

(7) The thermally conductive polysiloxane composition described in any one of (1) to (6), further comprising (C) a polyorganosiloxane containing one or more aliphatic unsaturated groups per molecule, (D) a polyorganohydrogensiloxane having two or more hydrogen atoms bonded to silicon atoms per molecule, and (E) a platinum catalyst.

(8) The thermally conductive polysiloxane composition described in any one of (1) to (7), wherein the component (B) comprises the alkoxysilyl group-containing compound, and the composition further comprises (F) a condensation catalyst.

(9) A heat dissipation material comprising the thermally conductive polysiloxane composition described in any one of (1) to (8).

Advantageous Effects of Invention

In the present invention, there can be provided a thermally conductive polysiloxane composition having high dispensability to offer excellent working efficiency and also having high thermal conductive properties, and a heat dissipation material including the composition.

DESCRIPTION OF EMBODIMENTS

The present invention is a thermally conductive polysiloxane composition containing (A) a thermally conductive filler and (B) at least one member selected from the group consisting of an alkoxysilyl group-containing compound and a dimethylpolysiloxane. In the thermally conductive polysiloxane composition, the component (A) comprises, based on the total mass of the component (A), 20 to 100 mass % of (A-1) round, indefinite-shaped or polyhedral aluminum nitride particles having an average particle diameter of not less than 50 μm and not more than 150 μm and (A-2) round, indefinite-shaped or polyhedral aluminum nitride particles having an average particle diameter of not less than 10 μm and less than 50 μm, and the content ratio of the component (A-1) to the component (A-2) on a mass basis is 50:50 to 95:5.

[Component (A)]

The component (A) is a thermally conductive filler, and comprises, based on the total mass of the component (A), 20 to 100 mass % of (A-1) round, indefinite-shaped or polyhedral aluminum nitride particles having an average particle diameter of not less than 50 μm and not more than 150 μm and (A-2) round, indefinite-shaped or polyhedral aluminum nitride particles having an average particle diameter of not less than 10 μm and less than 50 μm. The content ratio of the component (A-1) to the component (A-2) on a mass basis is 50:50 to 95:5.

The present inventors have focused attention on aluminum nitride as a thermally conductive material, and have conducted various studies on particle shapes, particle diameters and mixing ratios. As a result, the present inventors have found that a composition including spherical aluminum nitride particles exhibits good dispensability but does not show high thermal conductive properties probably because the contacts between the particles are point contacts. Further studies have shown that high dispensability and high thermal conductive properties of the composition can be obtained when round, indefinite-shaped or polyhedral aluminum nitride particles that allows the particles to be in contact together not via points but via surfaces over a certain range of area are used, and when at least two members of such particles having different particle diameters are combined in a specific ratio.

Component (A-1)

The component (A-1) is round, indefinite-shaped or polyhedral aluminum nitride particles having an average particle diameter of not less than 50 μm and not more than 150 μm. The aluminum nitride particles as the component (A-1) can offer significant enhancements in thermal conductivity as compared to when spherical aluminum nitride particles having a similar average particle diameter are used in such an amount that the same content will be obtained. Thus, the use of the component (A-1) allows the thermally conductive polysiloxane composition to attain excellent working efficiency and high thermal conductive properties. Further, the component (A-1) allows the thermally conductive polysiloxane composition to attain higher thermal conductivity than when alumina particles having a similar average particle diameter are used in such an amount that the same content will be obtained.

The term "round" means that the particle has few corners and has a rounded shape when viewed as a whole. The "round" shapes include elliptical spheres and the like, but do not include spheres. In the round particle, a part of the rounded shape may be, for example, flat, uneven or the like.

The term "polyhedral" means that the particle has a shape defined by a plurality of planes such as hexahedral, octahedral or dodecahedral. In these shapes, the planes do not necessarily have the same shape, and the sides at which planes intersect with each other, and the apexes at which some sides intersect with one another may be rounded or uneven. Polyhedral aluminum nitride particles are preferably convex polyhedra.

The term "indefinite-shaped" means that the particle does not have a regular shape such as a "round" shape or a "polyhedral" shape.

From the point of view of the dispensability of the thermally conductive polysiloxane composition, the component (A-1) is particularly preferably round or indefinite-shaped aluminum nitride particles.

The average particle diameter of the component (A-1) is not less than 50 μm and not more than 150 μm. The component (A-1) has a peak of the particle size distribution in the range of not less than 50 μm and not more than 150 μm. By virtue of the component (A-1) having an average particle diameter of not less than 50 μm and not more than 150 μm, the thermally conductive polysiloxane composition tends to attain high stability without problems such as sedimentation of the component (A-1) even when the polysiloxane composition is filled with the component (A) at a high filling ratio, and the thermally conductive polysiloxane composition can attain high dispensability and high thermal conductive properties. The average particle diameter of the component (A-1) is more preferably not less than 50 μm and not more than 120 μm, still more preferably not less than 50 μm and not more than 100 μm, and particularly preferably not less than 55 μm and not more than 85 μm.

In the present invention, the measured values of average particle diameter are median diameters (d50) measured by a laser diffraction/scattering method.

Component (A-2)

The component (A-2) is round, indefinite-shaped or polyhedral aluminum nitride particles having an average particle diameter of not less than 10 μm and less than 50 μm. The aluminum nitride particles as the component (A-2) are blended with the component (A-1) in the predetermined ratio, and thereby the thermally conductive polysiloxane composition can attain enhanced dispensability while maintaining high thermal conductivity. When combined with the component (A-1), the aluminum nitride particles as the component (A-2) can offer higher thermal conductive properties than when spherical aluminum nitride particles having a similar average particle diameter are used. Further, the component (A-2) combined with the component (A-1) allows the thermally conductive polysiloxane composition to attain higher thermal conductivity than when alumina particles having a similar average particle diameter are used in such an amount that the same content will be obtained.

From the point of view of the dispensability of the thermally conductive polysiloxane composition, the component (A-2) is particularly preferably round or indefinite-shaped aluminum nitride particles.

The average particle diameter of the component (A-2) is not less than 10 µm and less than 50 µm. The component (A-2) has a peak of the particle size distribution in the range of not less than 10 µm and less than 50 µm. By virtue of the component (A-2) having an average particle diameter of not less than 10 µm and less than 50 µm, the thermally conductive polysiloxane composition tends to attain higher stability without problems such as sedimentation of the component (A-1) even when the polysiloxane composition is filled with the component (A-1) and the component (A-2) at a high filling ratio, and the thermally conductive polysiloxane composition can attain high dispensability and high thermal conductive properties. The average particle diameter of the component (A-2) is more preferably not less than 10 µm and not more than 40 µm, and particularly preferably not less than 13 µm and not more than 35 µm.

The dispensability of the thermally conductive polysiloxane composition is advantageously further enhanced when the component (A-2) has an oil absorption of 5 to 40 g/100 g as measured by a boiled linseed oil method in accordance with JIS K5101-13-2. The oil absorption of the component (A-2) is more preferably 10 to 35 g/100 g, still more preferably 15 to 30 g/100 g, and particularly preferably 15 to 25 g/100 g.

The component (A) comprises 20 to 100 mass % of the components (A-1) and (A-2) based on the total mass of the component (A). The content of the components (A-1) and (A-2) in the component (A) may be less than 100 mass %. The content of the components (A-1) and (A-2) is more preferably not less than 20 mass % and not more than 75 mass %, still more preferably not less than 25 mass % and not more than 70 mass %, and particularly preferably not less than 30 mass % and not more than 65 mass %. When the content of the components (A-1) and (A-2) is less than 20 mass %, the thermally conductive polysiloxane composition is poor in thermal conductive properties. The dispensability tends to be further enhanced when the content of the component (A-1) is 75 mass % or less.

The content ratio of the component (A-1) to the component (A-2) is 50:50 to 95:5 on a mass basis. A high proportion of the component (A-1) increases the thermal conductive properties of the thermally conductive polysiloxane composition, but tends to lead to a decrease in dispensability. From the point of view of the balance between thermal conductive properties and dispensability, the content ratio of the component (A-1) to the component (A-2) is more preferably 55:45 to 85:15, still more preferably 55:45 to 75:25, and particularly preferably 55:45 to 65:35. When the content ratio of the component (A-1) to the component (A-2) is less than 50:50, the thermally conductive polysiloxane composition is poor in thermal conductive properties. When the content ratio of the component (A-1) to the component (A-2) is higher than 95:5, the thermally conductive polysiloxane composition is poor in dispensability.

The aluminum nitride particles of the components (A-1) and (A-2) may be synthesized by, for example, a so-called direct nitriding method, reductive nitriding method or the like. The particle diameter of aluminum nitride particles produced by a direct nitriding method may be brought to the desired range by post treatment such as pulverization. Alternatively, the aluminum nitride particles as the components (A-1) and (A-2) are commercially available, and, for example, TOYALNITE (registered trademark) TFZ-S20P, TFZ-N30P, TFZ-S30P, TFZ-N60P, TFZ-N80P and TFZ-N100P manufactured by Toyo Aluminium K.K. may be used.

The oil absorption of the aluminum nitride particles as the component (A-2) is a value measured by a boiled linseed oil method in accordance with JIS K5101-13-2.

The aluminum nitride particles as the components (A-1) and (A-2) may be a single kind of particles or a combination of two or more kinds of particles, respectively.

Component (A-3)

In order to ensure that the thermally conductive polysiloxane resin composition is filled with (A) a thermally conductive filler at a high filling ratio and achieve further enhancements in dispensability and thermal conductive properties, it is preferable that the component (A) further comprises a thermally conductive filler having a different average particle diameter from the components (A-1) and (A-2). Specifically, the component (A) preferably further comprises, based on the total mass of the component (A), 1 to 80 mass % of (A-3) inorganic particles having an average particle diameter of not less than 0.1 µm and less than 10 µm. The component (A-3) has a peak of the particle size distribution in the range of not less than 0.1 µm and less than 10 µm. By virtue of the component (A) further comprising the component (A-3), the thermally conductive polysiloxane composition tends to attain still enhanced stability without problems such as sedimentation of the component (A-1) even when the polysiloxane composition is filled with the component (A) at a high filling ratio, and the thermally conductive polysiloxane composition can attain high dispensability and high thermal conductive properties.

The content of the component (A-3) is more preferably 10 to 70 mass %, still more preferably 20 to 60 mass %, and particularly preferably 35 to 55 mass % based on the total mass of the component (A). The total of the components (A-1) to (A-3) preferably represents 80 to 100 mass %, more preferably 90 to 100 mass %, and particularly preferably 95 to 100 mass % of the total mass of the component (A).

More preferably, the component (A-3) comprises (A-3a) inorganic particles having an average particle diameter of not less than 1 µm and less than 10 µm and (A-3b) inorganic particles having an average particle diameter of not less than 0.1 µm and less than 1 µm, and the component (A) includes 1 to 50 mass % of the component (A-3a) and 1 to 50 mass % of the component (A-3b) based on the total mass of the component (A).

The present inventors have found that when the composition is prepared using the component (A-1), the component (A-2) and further the component (A-3), particularly the components (A-3a) and (A-3b), the component (A) is mixed into the component (B) with enhanced efficiency and the resultant composition tends to be uniform and attain higher dispensability, as compared to when the composition is prepared using a binary system including the components (A-1) and (A-2).

The average particle diameter of the component (A-3a) is not less than 1 μm and less than 10 μm. The component (A-3a) has a peak of the particle size distribution in the range of not less than 1 μm and less than 10 μm. By virtue of the component (A-3a) having an average particle diameter of not less than 1 μm and less than 10 μm, the components (A-1) to (A-3) can be mixed into the component (B) with still enhanced efficiency, and the resultant composition advantageously tends to be uniform and attain still enhanced dispensability. The average particle diameter of the component (A-3a) is more preferably not less than 1 μm and less than 9 μm, and particularly preferably not less than 2 μm and less than 8 μm.

The average particle diameter of the component (A-3b) is not less than 0.1 μm and less than 1 μm. The component (A-3b) has a peak of the particle size distribution in the range of not less than 0.1 μm and less than 1 μm. The component (A-3b) having an average particle diameter of not less than 0.1 μm and less than 1 μm offers advantages in terms of thermal conductive properties. The average particle diameter of the component (A-3) is more preferably not less than 0.15 μm and not more than 0.9 μm, and particularly preferably not less than 0.2 μm and not more than 0.8 μm.

In order to obtain uniformity, high dispensability and high thermal conductive properties of the thermally conductive polysiloxane resin composition, the blending ratio of the components (A-1), (A-2), (A-3a) and (A-3b) based on the total mass of the component (A) is preferably 20 to 60 mass % of the component (A-1), 2 to 25 mass % of the component (A-2), 1 to 40 mass % of the component (A-3a) and 1 to 30 mass % of the component (A-3b), more preferably 20 to 42 mass % of the component (A-1), 3 to 22 mass % of the component (A-2), 5 to 40 mass % of the component (A-3a) and 5 to 30 mass % of the component (A-3b), still more preferably 22 to 35 mass % of the: component (A-1), 10 to 20 mass % of the component (A-2), 20 to 35 mass % of the component (A-3a) and 10 to 25 mass % of the component (A-3b), and particularly preferably 22 to 30 mass % of the component (A-1), 15 to 20 mass % of the component (A-2), 25 to 35 mass % of the component (A-3a) and 15 to 25 mass % of the component (A-3b).

The inorganic particles as the component (A-3a) and the component (A-3b) may be any inorganic particles without limitation as long as the inorganic particles have thermal conductive properties. As the inorganic particles, for example, metal oxides such as alumina, zinc oxide, magnesium oxide and silica; nitrides such as aluminum nitride, silicon nitride and boron nitride; metals such as aluminum, copper, silver and gold; and metal/metal oxide core shell particles can be used.

In order to obtain uniformity, high dispensability and high thermal conductive properties of the thermally conductive polysiloxane resin composition, the inorganic particles as the components (A-3a) and (A-3b) are preferably silicon nitride particles, aluminum nitride particles or alumina particles, respectively.

Examples of the particle shapes of the components (A-3a) and (A-3b) include, but are not limited to, spherical shapes, round shapes, indefinite shapes and polyhedral shapes.

The components (A-3a) and (A-3b) may be a single kind of particles or a combination of two or more kinds of particles, respectively.

Organic or inorganic particles other than the components (A-1) to (A-3) may be added to the thermally conductive polysiloxane resin composition while still ensuring that the advantageous effects of the present invention are not impaired.

[Component (B)]

The component (B) is at least one member selected from the group consisting of an alkoxysilyl group-containing compound and a dimethylpolysiloxane.

The alkoxysilyl group-containing compounds as the component (B) are preferably compounds that have in the molecule at least an alkoxysilyl group represented by the following general formula:

wherein $R^{11}$ is a C1-C6 alkyl group, preferably a methyl group, $R^{12}$ is a C1-C6 alkyl group, preferably a methyl group, and the letter z is 1, 2 or 3. Examples of the component (B) include components (B-1) to (B-5) that are compounds described below.

Component (B-1)

The compounds having an alkoxysilyl group of the general formula (I) may be compounds represented by the general formula (1) below. It is understood that in such alkoxysilyl group-containing compounds, units containing $R^1$, units containing $R^2$, and units represented by $SiR^3{}_2O$ are not necessarily arranged as shown in the general formula (1) below, and, for example, a unit represented by $SiR^3{}_2O$ may be present between a unit containing $R^1$ and a unit containing $R^2$.

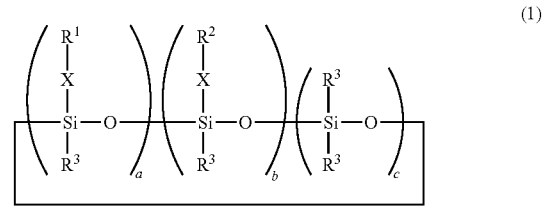

wherein:
$R^1$ is a group having a C1-C4 alkoxysilyl group;
$R^2$ is a C6-C18 monovalent hydrocarbon group or a siloxane unit-containing group represented by the following general formula (2):

wherein $R^4$ independently at each occurrence is a C1-C12 monovalent hydrocarbon group, Y is a group selected from the group consisting of $R^1$, $R^4$ and an aliphatic unsaturated group, and the letter d is an integer of 2 to 500, preferably an integer of 4 to 400, more preferably an integer of 10 to 200 and particularly preferably an integer of 10 to 60;
X independently at each occurrence is a C2-C10 divalent hydrocarbon group;
the letters a and b are each independently an integer of 1 or greater;
the letter c is an integer of 0 or greater;
a+b+c is an integer of 4 or greater; and R³ independently at each occurrence is a C1-C6 monovalent hydrocarbon group or a hydrogen atom.

As the alkoxysilyl group-containing compounds as the component (B-1), compounds represented by the following structural formulae can be preferably used. However, the compounds are not limited thereto.

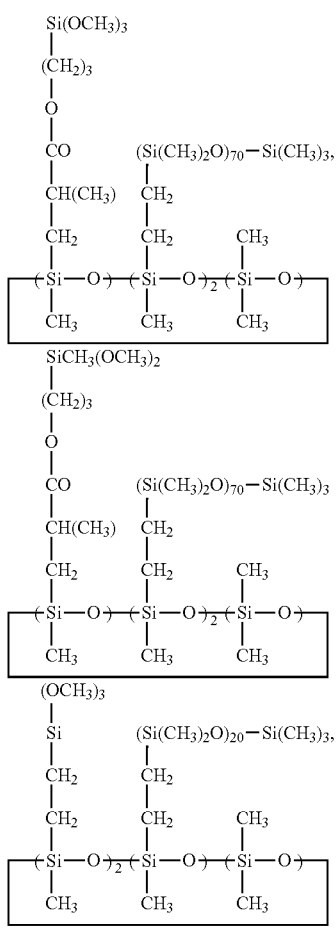

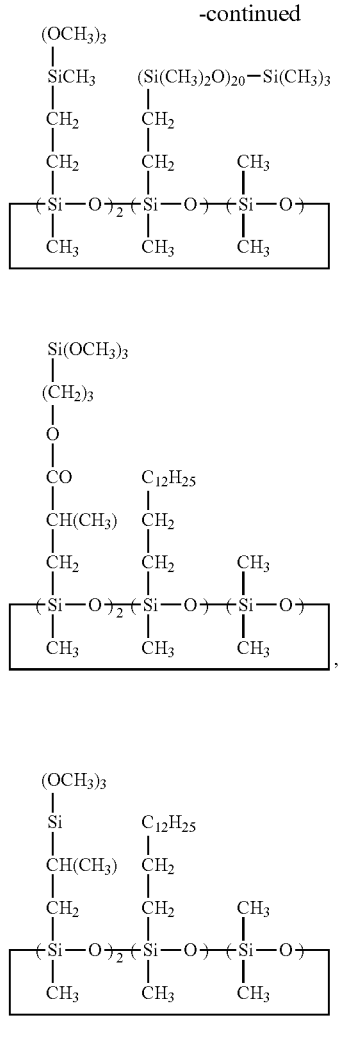

Preferred examples of the alkoxysilyl group-containing compounds as the component (B-1) further include compounds represented by the following structural formulae.

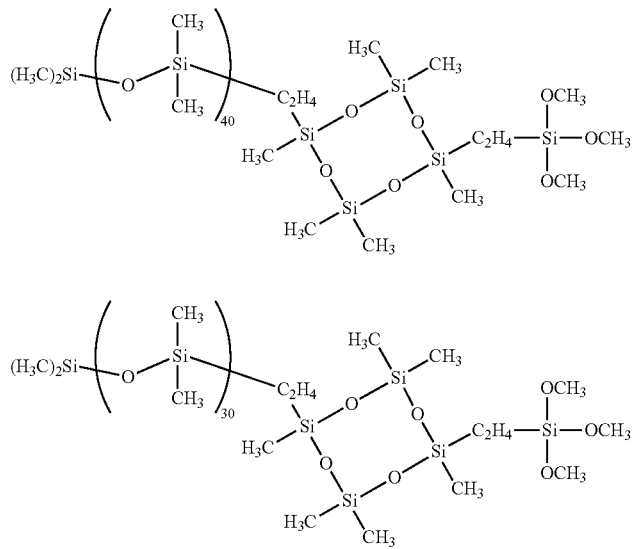

-continued
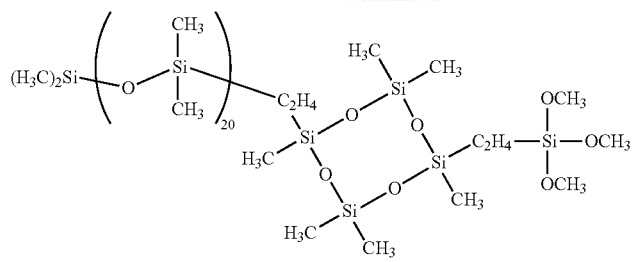
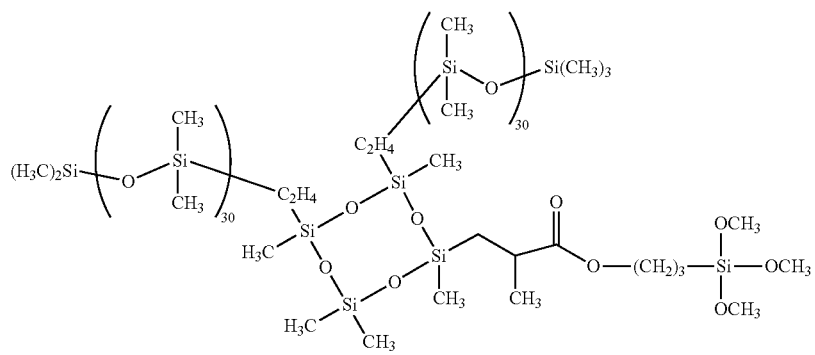
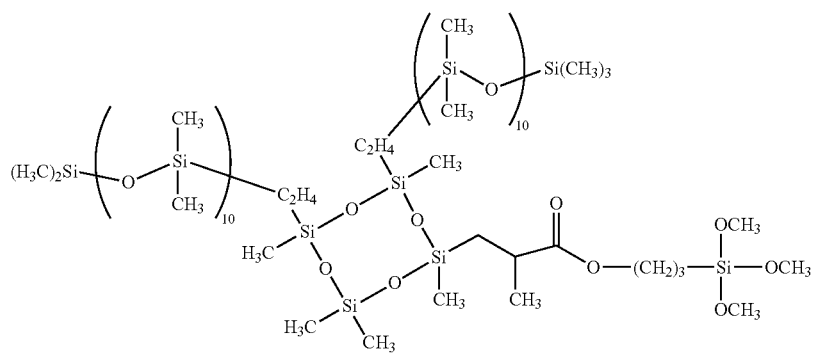
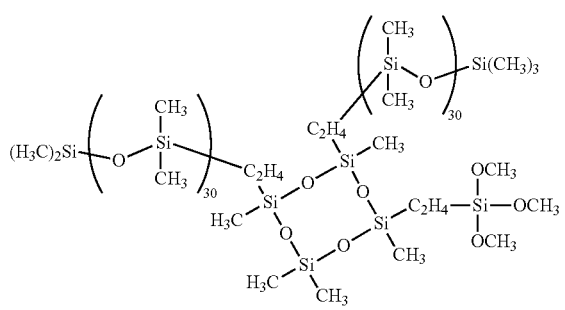
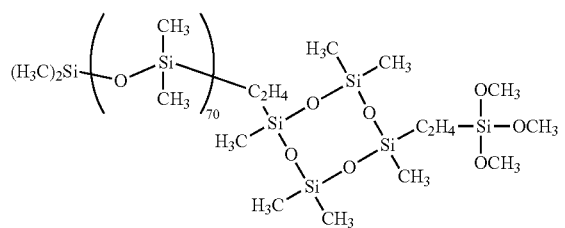

-continued

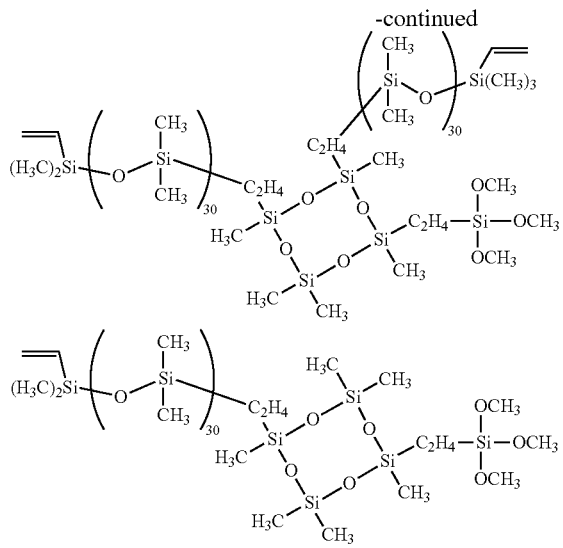

Component (B-2)

As the alkoxysilyl group-containing compounds as the component (B), compounds represented by the following general formula (3) can be used.

wherein $R^{21}$ independently at each occurrence is a C6-C15 alkyl group, $R^{22}$ independently at each occurrence is a C1-C12 unsubstituted or substituted, monovalent hydrocarbon group (except a C6-C12 alkyl group), $R^{23}$ independently at each occurrence is a C1-C6 alkyl group, the letter e is an integer of 0 to 3, preferably 1, the letter f is an integer of 0 to 2, and e+f is an integer of 1 to 3.

Examples of $R^{21}$ include hexyl group, octyl group, nonyl group, decyl group, dodecyl group and tetradecyl group. As a result of $R^{21}$ being a C6-C15 alkyl group, the component (B) is liquid at room temperature and is easily handled, and tends to exhibit good wetting properties with respect to the component (A).

Examples of $R^{22}$ include alkyl groups such as methyl group, ethyl group, propyl group, isopropyl group, butyl group, isobutyl group and tert-butyl group; cycloalkyl groups such as cyclopentyl group, cyclohexyl group and cyclobutyl group; aliphatic unsaturated groups such as vinyl group and allyl group; aryl groups such as phenyl group, tolyl group, xylyl group and naphthyl group; aralkyl groups such as benzyl group, 2-phenylethyl group, 2-methyl-2-phenylethyl group and phenylpropyl group; and groups resulting from substituting part or all of hydrogen atoms of the above hydrocarbon groups with, for example, a halogen atom such as chlorine, fluorine or bromine, or a cyano group, with specific examples including halogenated hydrocarbon groups such as chloromethyl group, trifluoropropyl group, 3,3,3-trifluoropropyl group, 2-(nonafluorobutyl) ethyl group, 2-(heptadecafluorooctyl) ethyl group, chlorophenyl group, bromophenyl group, dibromophenyl group, tetrachlorophenyl group, fluorophenyl group and difluorophenyl group, and cyanoalkyl groups such as α-cyanoethyl group, β-cyanopropyl group and y-cyanopropyl group. Preferred groups are methyl group and ethyl group.

Examples of $R^{23}$ include methyl group, ethyl group, propyl group, butyl group, pentyl group and hexyl group, with methyl group and ethyl group being preferable.

Examples of the alkoxysilyl group-containing compounds of the general formula (3) in which e=1 include the following compounds:

$C_6H_{13}Si(OCH_3)_3$
$C_{10}H_{21}Si(OCH_3)_3$
$C_{12}H_{25}Si(OCH_3)_3$
$C_{12}H_{25}Si(OC_2H_5)_3$
$C_{10}H_{21}Si(CH_3)(OCH_3)_2$
$C_{10}H_{21}Si(C_6H_5)(OCH_3)_2$
$C_{10}H_{21}Si(CH_3)(OC_2H_5)_2$
$C_{10}H_{21}Si(CH=CH_2)(OCH_3)_2$
$C_{10}H_{21}Si(CH_2CH_2CF_3)(OCH_3)_2$.

Component (B-3)

As the alkoxysilyl group-containing compounds as the component (B), dimethylpolysiloxanes of the general formula (4) below which are blocked with an alkoxysilyl group at one end of the molecular chain, can be used.

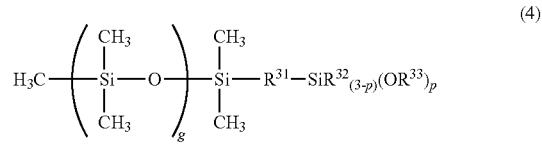

wherein $R^{31}$ is —O— or —$CH_2CH_2$—; $R^{32}$ independently at each occurrence is an unsubstituted or substituted, monovalent hydrocarbon group, specifically, may be any of the groups mentioned as examples of $R^{22}$ in the general formula (3), and is preferably an alkyl group or an aryl group, more preferably a methyl group or a phenyl group; $R^{33}$ independently at each occurrence is a $C_1$-$C_6$ alkyl group, preferably a methyl group, an ethyl group, a propyl group, a butyl group or a hexyl group; the letter g is an integer of 5 to 100, preferably 5 to 70, particularly preferably 10 to 50; and the letter p is an integer of 1 to 3, preferably 2 or 3.

One or more of the methyl groups in the general formula (4) may be substituted with a monovalent hydrocarbon group other than the methyl group. Examples of such substituents include alkyl groups such as ethyl group, propyl group, hexyl group and octyl group; cycloalkyl groups such as cyclopentyl group and cyclohexyl group; aryl groups such as phenyl group and tolyl group; aralkyl groups such as 2-phenylethyl group and 2-methyl-2-phenylethyl group; and $C_1$-$C_{10}$ halogenated hydrocarbon groups such as 3,3,3-trifluoropropyl group, 2-(nonafluorobutyl) ethyl group, 2-(heptadecafluorooctyl) ethyl group and p-chlorophenyl group.

Component (B4)

As the alkoxysilyl group-containing compounds as the component (B), compounds of the general formula (5) below which are blocked with alkoxysilyl groups at both ends of the molecular chain, can be used.

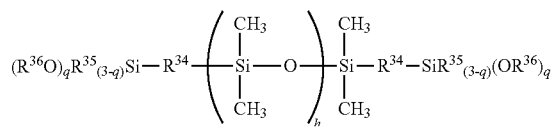

(5)

wherein $R^{34}$, $R^{35}$, $R^{36}$ and q are independently defined in the same way as $R^{31}$, $R^{32}$, $R^{33}$ and p in the general formula (4), respectively, and the letter h is such an integer that the viscosity at 23° C. is 10 to 10,000 mPa·s, more preferably 20 to 5,000 mPa·s.

In the present specification, the viscosity is a value measured with a rotational viscometer at 23° C. in accordance with JIS K6249.

One or more of the methyl groups in the general formula (5) may be substituted with a monovalent hydrocarbon group other than the methyl group. Examples of such substituents include those mentioned as examples of the substituents in place of the methyl groups in the general formula (4).

Examples of the alkoxysilyl group-containing compounds represented by the general formula (5) include dimethylpolysiloxanes having both ends blocked by methyldimethoxy groups and dimethylpolysiloxanes having both ends blocked by trimethoxy groups.

Component (B-5)

As the dimethylpolysiloxanes as the component (B), linear compounds represented by the following general formula (6) can be used.

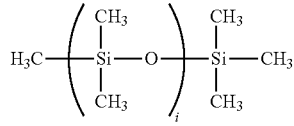

(6)

wherein the letter i is such an integer that the viscosity at 23° C. is 10 to 10,000 mPa·s, more preferably 20 to 5,000 mPa·s.

One or more of the methyl groups in the general formula (6) may be substituted with a monovalent hydrocarbon group other than the methyl group. Examples of such substituents include those mentioned as examples of the substituents in place of the methyl groups in the general formula (4).

To attain enhanced workability, the component (B) is preferably the component (B-1).

The content of the component (B) in the thermally conductive polysiloxane composition is preferably 0.1 to 30 parts by mass, more preferably 0.5 to 20 parts by mass, and still more preferably 1 to 10 parts by mass per 100 parts by mass of the component (A).

The component (B) may be a single kind of a component or a combination of two or more kinds of components.

[Other Components]

The thermally conductive polysiloxane composition can contain a component other than the component (A) and the component (B) in accordance with, for example, the purpose of use of the composition and the method for using the composition.

[Component (C)]

As a component (C) which is a polyorganosiloxane (other than the component (B)) containing one or more aliphatic unsaturated groups per molecule, compounds represented by the average compositional formula (II) below can be used.

(II)

wherein $R^{41}$ is an aliphatic unsaturated group, $R^{42}$ is a substituted or unsubstituted, monovalent hydrocarbon group containing no aliphatic unsaturated bonds, and the letters j and k are positive numbers satisfying 0<j<3, 0<k<3, and 1<j+k<3.

$R^{41}$ is preferably a C2-C8 aliphatic unsaturated group such as, for example, a vinyl group, an allyl group, a propenyl group, a 1-butenyl group or a 1-hexenyl group, and is preferably a vinyl group. One or more, preferably two or more of the aliphatic unsaturated groups are contained in the molecule. The aliphatic unsaturated group may be bonded to a silicon atom at an end of the molecular chain, may be bonded to a silicon atom in the middle of the molecular chain, or may be bonded to both.

Specific examples of $R^{42}$ include those mentioned as examples of $R^{22}$ in the general formula (3) except aliphatic unsaturated groups such as vinyl group and allyl group. Among such groups, alkyl groups and aryl groups are preferable, and methyl group and phenyl group are more preferable.

The letters j and k are preferably numbers that satisfy 0.0005≤j≤1, 1.5≤k<2.4 and 1.5<j+k<2.5, more preferably 0.001≤j≤0.5, 1.8≤k≤2.1 and 1.8<j+k≤2.2.

The molecular structure of the component (C) may be linear, branched or cyclic, and is preferably linear or branched. The component (C) is preferably a dimethylpolysiloxane having aliphatic unsaturated groups at one end or both ends of the molecular chain, and is particularly preferably a dimethylpolysiloxane having vinyl groups at one end or both ends of the molecular chain.

The viscosity of the component (C) at 23° C. is preferably 10 to 10,000 mPa·s, and more preferably 20 to 5,000 mPa·s.

When the composition contains the component (C), the total amount of the component (B) and the component (C) is preferably 1.5 to 35 parts by mass, more preferably 1.5 to 30 parts by mass, still more preferably 1.5 to 28 parts by mass, and particularly preferably 3.0 to 10 parts by mass per 100 parts by mass of the component (A). The component (B) and the component (C) are added so that the proportion of the component (C) in the total amount of the component (B) and the component (C) is 15 to 98 mass %, preferably 18 to 98 mass %, and more preferably 20 to 98 mass %.

The component (C) may be a single kind of a component or a combination of two or more kinds of components.

[Component (D)]

A component (D) is a polyorganohydrogensiloxane (other than the component (B)) having two or more hydrogen atoms bonded to silicon atoms per molecule, and serves as a crosslinking agent for the component (C) and also for the component (B) when the component (B) is an alkoxysilyl group-containing compound having at least one aliphatic unsaturated group (for example, a compound of the general formula (1) in which Y in $R^2$ is an aliphatic unsaturated group, a compound of the general formula (3) in which $R^{22}$ is an aliphatic unsaturated group, a compound of the general formula (4) in which $R^{32}$ is an aliphatic unsaturated group, or a compound of the general formula (5) in which $R^{35}$ is an aliphatic unsaturated group). The component (D) has two or more, preferably three or more hydrogen atoms bonded to silicon atoms per molecule. The hydrogen atoms may be bonded to a silicon atom at an end of the molecular chain, may be bonded to a silicon atom in the middle of the molecular chain, or may be bonded to both. A polyorganohydrogensiloxane that has hydrogen atoms bonded only to both terminal silicon atoms can be used. The molecular structure of the component (D) may be linear, branched, cyclic or three-dimensional network. The component (D) may be a single kind of a component or a combination of two or more kinds of components.

As the component (D), compounds represented by the average compositional formula (III) below can be used.

$$R^{51}{}_m H_n SiO_{[4-(m+n)]/2} \quad (III)$$

wherein $R^{51}$ is a substituted or unsubstituted, monovalent hydrocarbon group containing no aliphatic unsaturated bonds, and the letters m and n are numbers satisfying $0.5 \leq m \leq 2$, $0 < n \leq 2$ and $0.5 < m+n \leq 3$.

Specific examples of $R^{51}$ include those mentioned as examples of $R^{22}$ in the general formula (3) except aliphatic unsaturated groups such as vinyl group and allyl group. Among such groups, alkyl groups are preferable in view of easy synthesis and cost, and methyl group is more preferable.

The letters m and n are preferably numbers satisfying $0.6 \leq m \leq 1.9$, $0.01 \leq n \leq 1.0$ and $0.6 \leq m+n \leq 2.8$.

The viscosity of the component (D) at 23° C. is preferably 10 to 500 mPa·s.

The component (D) is added such that the ratio of the number of hydrogen atoms bonded to silicon atoms in the component (D) is 0.1 to 1.5, preferably 0.2 to 1.2, relative to the number of aliphatic unsaturated groups bonded to silicon atoms in the component (C) and also in the component (B) when the component (B) is an alkoxysilyl group-containing compound having at least one aliphatic unsaturated group. Such an amount of the component (D) tends to ensure that the thermally conductive polysiloxane composition will exhibit good stability over time and will be cured to a sufficient crosslinking degree to give a cured product having appropriate hardness.

[Component (E)]

A component (E) is a platinum catalyst, and promotes the curing after mixing the component (C) and the component (B) when the component (B) is an alkoxysilyl group-containing compound having at least one aliphatic unsaturated group, with the component (D). As the component (E), a well-known catalyst used in hydrosilylation reaction can be used. Examples include platinum black, platinum (IV) chloride, chloroplatinic acid, reaction products of chloroplatinic acid with a monohydric alcohol, complexes of chloroplatinic acid with an olefin or a vinylsiloxane, platinum-vinyl tetramer complexes and platinum bisacetoacetates. The added amount of the component (E) may be adjusted appropriately in accordance with, for example, a desired curing rate, and is preferably in the range of 0.1 to 1,000 ppm in terms of platinum element with respect to the total amount of the component (C), the component (B) when the component (B) is an alkoxysilyl group-containing compound having at least one aliphatic unsaturated group, and the component (D). The component (E) may be a single kind of a component or a combination of two or more kinds of components.

To obtain a longer pot life, the activity of the catalyst may be suppressed by the addition of (E-2) a reaction inhibitor. Examples of known reaction inhibitors for platinum group metals include acetylene alcohols such as 2-methyl-3-butyn-2-ol, 1-ethynyl-1-cyclohexanol and 1-ethynyl-2-cyclohexanol.

[Component (F)]

A component (F) is a condensation catalyst, and promotes the condensation and curing of the component (B) when the component (B) comprises an alkoxysilyl group-containing compound. As the component (F), a known silanol condensation catalyst can be used. Examples include metal catalysts, for example, titanium esters such as tetrabutyl titanate and tetrapropyl titanate; organotin compounds such as dibutyltin dilaurate, dibutyltin maleate and dibutyltin diacetate; tin carboxylate salts such as tin octylate, tin naphthenate, tin laurate and tin versatate; reaction products of dibutyltin oxide and a phthalic acid ester; dibutyltin diacetyl acetonate; organoaluminum compounds such as aluminum triacetyl acetonate, aluminum trisethylacetoacetate and diisopropoxyaluminum ethyl acetoacetate; chelate compounds such as diisopropoxy-bis (ethyl acetoacetate) titanium, zirconium tetraacetyl acetonate and titanium tetraacetyl acetonate; lead octylate; iron naphthenate; and bismuth compounds such as bismuth-tris (neodecanoate) and bismuth-tris (2-ethylhexoate). Further, known amine catalysts such as laurylamine may be used. Among such catalysts, particularly preferred catalysts are tin carboxylate salts and organotin compounds such as dibutyltin dilaurate, dibutyltin maleate, dibutyltin diacetate, tin octylate, tin naphthenate, tin laurate and tin versatate; reaction products of dibutyltin oxide and a phthalic acid ester; tin catalysts such as dibutyltin diacetyl acetonate; and chelate compounds such as diisopropoxy-bis (ethyl acetoacetate) titanium.

The added amount of the component (F) may be adjusted appropriately in accordance with, for example, a desired curing rate, and may be 0.01 to 20 parts by mass, preferably 0.05 to 15 parts by mass, and more preferably 0.1 to 12 parts by mass per 100 parts by mass of the alkoxysilyl group-containing compound in the component (B).

The component (F) may be a single kind of a component or a combination of two or more kinds of components.

[Component (G)]

Where necessary, the thermally conductive polysiloxane composition may further contain, for example, flame retardants, heat resistance improvers, plasticizers, colorants, tackifiers and diluents in such an amount that the objects of the present invention are not impaired.

Preferred Embodiments of Compositions

The thermally conductive polysiloxane compositions may be compositions according to preferred embodiments 1 to 3 below that contain the component (A), the component (B) and further other components described hereinabove.

1. Grease-Type Thermally Conductive Polysiloxane Compositions

The thermally conductive polysiloxane composition may be a grease-type thermally conductive polysiloxane composition including the component (A) and the component (B) alone or including the component (A), the component (B) and further the component (C). The thermally conductive polysiloxane compositions according to this embodiment can be used as a heat dissipation material directly without being cured. The grease-type thermally conductive polysiloxane composition may further contain at least one member selected from the group consisting of the components (D) to (G), but preferably does not contain the components (D) to (F).

2. Addition Reaction-Type Thermally Conductive Polysiloxane Compositions

The thermally conductive polysiloxane composition may contain the component (A), the component (B) that is an alkoxysilyl group-containing compound having at least one aliphatic unsaturated group (for example, a compound of the general formula (1) in which Y in $R^2$ is an aliphatic unsaturated group, a compound of the general formula (3) in which $R^{22}$ is an aliphatic unsaturated group, a compound of the general formula (4) in which $R^{32}$ is an aliphatic unsaturated group, or a compound of the general formula (5) in which $R^{35}$ is an aliphatic unsaturated group), the component (D) and the component (E). Further, the thermally conductive polysiloxane composition may contain the component (A), the component (B) and the components (C), (D) and (E). The thermally conductive polysiloxane compositions according to this embodiment can be cured by addition reaction and are advantageous in that cured products of the thermally conductive polysiloxane compositions are usable as heat dissipation materials. In the latter case, the component (B) may have or may not have an aliphatic unsaturated group. The addition reaction-type thermally conductive polysiloxane compositions may further contain at least one member selected from the group consisting of the component (F) and the component (G).

3. Condensation Reaction-Type Thermally Conductive Polysiloxane Compositions

The thermally conductive polysiloxane composition may contain the component (A), the component (B) comprising an alkoxysilyl group-containing compound, and further the component (F). The thermally conductive polysiloxane compositions according to this embodiment can be cured by condensation reaction and is advantageous in that cured products of the thermally conductive polysiloxane compositions are usable as heat dissipation materials. The condensation reaction-type thermally conductive polysiloxane composition may further contain at least one member selected from the group consisting of the components (C), (D), (E) and (G).

In an embodiment of the condensation reaction-type thermally conductive polysiloxane composition, the component (B) comprises at least an alkoxysilyl group-containing compound. The alkoxysilyl group-containing compound as the component (B) is preferably a dimethylpolysiloxane containing a dialkoxysilyl group or a trialkoxysilyl group at one end or both ends of the molecular chain, and is particularly preferably a dimethylpolysiloxane containing a dialkoxysilyl group or a trialkoxysilyl group at both ends of the molecular chain.

The dispensability of the thermally conductive polysiloxane composition can be evaluated based on the flow rate (g/min) of the composition. The flow rate of the thermally conductive polysiloxane composition can be evaluated as follows.

(1) A 30 cc EFD syringe manufactured by Nordson Corporation is filled with the composition.
(2) The composition is dispensed at 0.62 MPa for 1 minute using SDP400 manufactured by SAN-EI TECH Ltd. as a dispenser.
(3) The flow rate (g/min) of the composition is determined from weighing the amount of the composition dispensed.

The thermally conductive polysiloxane composition advantageously exhibits higher dispensability with increasing flow rate of the composition. The thermally conductive polysiloxane composition is practically usable without problems when the flow rate is 20 g/min or more. High dispensability is advantageously obtained when the flow rate is 35 g/min or more. Particularly high dispensability is advantageously obtained when the flow rate is 70 g/min or more.

[Methods for Producing Thermally Conductive Polysiloxane Compositions]

The thermally conductive polysiloxane composition can be obtained by mixing the component (A), the component (B) and other optional components as required, with a mixing machine such as a planetary mixer. Where necessary, the components may be mixed while performing heating at a temperature in the range of 50 to 150° C. To achieve uniform finish, the mixture is preferably kneaded under high shear force. Examples of the kneading devices include three-roll mills, colloid mills and sand grinders, with three-roll mills being particularly preferable.

[Methods for Curing Thermally Conductive Polysiloxane Compositions]

For example, the addition reaction-type thermally conductive polysiloxane composition may be cured by applying the composition to an adherend which requires heat dissipation, and leaving the composition at room temperature or heating the composition at a temperature of 50 to 200° C. From the viewpoint of quick curing, the method in which the composition is heated is preferably employed.

For example, the condensation reaction-type thermally conductive polysiloxane composition may be cured by applying the composition to an adherend which requires heat dissipation, and leaving the composition at room temperature to allow the composition to cure with moisture in the air or curing the composition under humidified conditions.

[Heat Dissipation Materials]

The thermally conductive polysiloxane compositions, or heat dissipation materials comprising the thermally conductive polysiloxane compositions have a thermal conductivity of not less than 2.0 W/(m·K) as measured by a hot disk method at 23° C. For high-heat dissipation applications, the thermal conductivity is preferably not less than 7.5 W/(m·K), more preferably not less than 8.0 W/(m·K), and particularly preferably not less than 8.5 W/(m·K). To enhance the heat dissipation effects by controlling the thermal conductivity, the content of the component (A) in the composition is preferably not less than 80 mass %, more preferably not less than 85 mass %, and still more preferably not less than 90 mass %. The content of the component (A) may be further increased in accordance with the thermal conductivity that is required.

For example, the heat dissipation materials can be used as heat dissipation materials for a PC/server having mounted a CPU which generates a large amount of heat, electronic devices having mounted a power module, a VLSI (a very large scale integrated circuit) or an optical part (such as an optical pickup and an LED), household electrical appliances (for example, AV devices such as a DVD/HDD recorder and a player, and an FPD), PC peripheral devices, home video game machines, automobiles, and industrial devices such as an inverter and a switching power supply. The heat dissipation materials can have a form of grease (paste), gel, rubber or the like.

EXAMPLES (Components Used)

Component (A-1)
  Indefinite-shaped aluminum nitride particles, average particle diameter 80 μm
  Indefinite-shaped aluminum nitride particles, average particle diameter 60 μm Component (A'): Other Thermally Conductive Filler
  Spherical aluminum nitride particles, average particle diameter 80 μm
  Spherical aluminum nitride particles, average particle diameter 60 μm Component (A-2)
  Indefinite-shaped aluminum nitride particles, average particle diameter 30 μm, oil absorption 41 g/100 g
  Round aluminum nitride particles, average particle diameter 20 μm, oil absorption 19 g/100 g
  Indefinite-shaped aluminum nitride particles, average particle diameter 20 μm, oil absorption 30 g/100 g Component (A-3a)
  Polyhedral alumina particles, average particle diameter 5.0 μm Component (A-3b)
  Polyhedral alumina particles, average particle diameter 0.4 μm Component (B-1)
  Trialkoxy group-containing polyorganosiloxane:

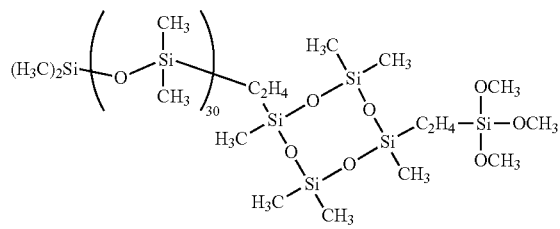

Component (B-2)
  Methyltrimethoxysilane

Component (B-4)
  Dimethylpolysiloxane having both-ends blocked by methyldimethoxy groups (viscosity: 30 mPa·s)

Component (B-5)
  Dimethylpolysiloxane having both-ends blocked by trimethylsilyl groups: $MD_{40}M$ (viscosity: 30 mPa·s)

Component (C)
  Dimethylpolysiloxane having both-ends blocked by vinyl groups: $M^{vi}D_{70}M^{vi}$ (viscosity: 130 mPa·s)
  Dimethylpolysiloxane having one-end blocked by a vinyl group: $MD_{30}M^{vi}$ (viscosity: 25 mPa·s)

Component (D)
  Polyorganohydrogensiloxane: $M^{H}D^{H}_{8}D_{42}M^{H}$ (viscosity: 45 mPa·s)

The viscosities of the components (B) to (D) at 23° C. were measured in accordance with JIS K6249 using a rotational viscometer rotor No. 1 at a rotational speed of 60 rpm for 1 minute.

Component (E)
  Platinum catalyst: Vinyl tetramer complex having a platinum content of 2%

Component (E-2)
  Reaction inhibitor: 1-Ethynyl-1-cyclohexanol

Component (F)
  Condensation catalyst: Diisopropoxy-bis (ethyl acetoacetate) titanium <Measurement Methods>

[Average Particle Diameter]
An average particle diameter (a median diameter d50) of the component (A) was measured by a laser diffraction-scattering method.

[Oil Absorption]
An oil absorption of the component (A-2) was measured based on a boiled linseed oil method in accordance with JIS K5101-13-2.

[Dispensability]
A flow rate (g/min) of the thermally conductive polysiloxane composition was measured as follows and used for the evaluation of dispensability.
  (1) A 30 cc EFD syringe manufactured by Nordson Corporation was filled with the composition.
  (2) The composition was dispensed at 0.62 MPa for 1 minute using SDP400 manufactured by SAN-EI TECH Ltd. as a dispenser.
  (3) The flow rate (g/min) of the composition was determined from weighing the amount of the composition dispensed.

Evaluation of Dispensability
A dispensability of the thermally conductive polysiloxane composition was evaluated based on the following criteria.
  ⊚: Flow rate is 70 g/min or more.
  ○: Flow rate is 35 g/min or more and less than 70 g/min.
  Δ: Flow rate is 20 g/min or more and less than 35 g/min.
  x: Flow rate is less than 20 g/min.

[Thermal Conductivity]
A thermal conductivity was measured at 23° C. in accordance with a hot disk method using a hot disk thermophysical properties measuring device (TPS 1500 manufactured by KYOTO ELECTRONICS MANUFACTURING CO., LTD.) and was evaluated based on the following criteria.
  ⊚: Thermal conductivity is 8.5 W/(m·K) or more.
  ○: Thermal conductivity is 8.0 W/(m·K) or more and less than 8.5 W/(m·K).
  Δ: Thermal conductivity is 7.5 W/(m·K) or more and less than 8.0 W/(m·K).
  x: Thermal conductivity is less than 7.5 W/(m·K).

Examples 1 to 5 and Comparative Examples 1 to 4

The components (A), (B) and (C) shown in Table 1 were respectively placed into a planetary mixer (manufactured by DALTON Corporation) and were mixed together by stirring at room temperature for 1 hour and further at 120° C. for 1 hour. The resultant mixture was cooled to 25° C. Thereafter, the components (D), (E) and (E-2) were added to and mixed with the resultant mixture to give an addition reaction-type thermally conductive polysiloxane composition. The flow rate of the composition thus obtained was measured, and the dispensability was evaluated. The results are shown in Table 1.

Each of the addition reaction-type thermally conductive polysiloxane compositions of Examples 1 to 5 and Comparative Examples 1 to 4 was thermally cured in a mold at 150° C. for 1 hour to give a 6 mm thick cured product of the addition reaction-type thermally conductive polysiloxane composition. The thermal conductivity of the cured products thus obtained was measured. The results are shown in Table 1.

TABLE 1

| | Raw materials | Example 1 | Example 2 | Example 3 | Example 4 | Example 5 |
|---|---|---|---|---|---|---|
| (A-1) | Indefinite-shaped aluminum nitride particles having average particle diameter of 80 μm | | | 31.16 | 26.71 | |
| | Indefinite-shaped aluminum nitride particles having average particle diameter of 60 μm | 40.07 | 26.71 | | | 26.71 |
| (A') | Spherical aluminum nitride particles having average particle diameter of 80 μm | | | | | |
| | Spherical aluminum nitride particles having average particle diameter of 60 μm | | | | | |
| (A-2) | Indefinite-shaped aluminum nitride particles having average particle diameter of 30 μm (oil absorption: 41 g/100 g) | | | 13.36 | | |
| | Round aluminum nitride particles having average particle diameter of 20 μm (oil absorption: 19 g/100 g) | 4.45 | 17.81 | | 17.81 | |
| | Indefinite-shaped aluminum nitride particles having average particle diameter of 20 μm (oil absorption: 30 g/100 g) | | | | | 17.81 |
| (A-3a) | Polyhedral alumina particles having average particle diameter of 5.0 μm | 31.06 | 31.06 | 31.06 | 31.06 | 31.06 |
| (A-3b) | Polyhedral alumina particles having average particle diameter of 0.4 μm | 18.12 | 18.12 | 18.12 | 18.12 | 18.12 |
| (B-1) | Trialkoxy group-containing polyorganosiloxane | 1.50 | 1.50 | 1.50 | 1.50 | 1.50 |
| (C) | Dimethylpolysiloxane having both-ends blocked by vinyl groups: $M^{vi}D_{70}M^{vi}$ (viscosity: 130 mPa · s) | 0.69 | 0.69 | 0.69 | 0.69 | 0.69 |
| | Dimethylpolysiloxane having one-end blocked by vinyl groups: $MD_{30}M^{vi}$ (viscosity: 25 mPa · s) | 3.48 | 3.48 | 3.48 | 3.48 | 3.48 |
| (D) | Polyorganohydrogensiloxane: $M^H D_8^H D_{42} M^H$ (viscosity: 45 mPa · s) | 0.63 | 0.63 | 0.63 | 0.63 | 0.63 |
| (E) | Platinum-vinyl tetramer complex (2% platinum) | 0.025 | 0.025 | 0.025 | 0.025 | 0.025 |
| (E-2) | 1-Ethynyl-1-cyclohexanol | 0.003 | 0.003 | 0.003 | 0.003 | 0.003 |
| | Total | 100.0 | 100.0 | 100.0 | 100.0 | 100.0 |
| | Content (%) of component (A) | 93.7% | 93.7% | 93.7% | 93.7% | 93.7% |
| | Content (%) of components (A-1) and (A-2) based on the total mass of component (A) | 47.5% | 47.5% | 47.5% | 47.5% | 47.5% |
| | Component (A-1): component (A-2) | 90:10 | 60:40 | 70:30 | 60:40 | 60:40 |
| | Flow rate (g/min) | 39 | 74 | 35 | 84 | 41 |
| | Dischargeability evaluation | ○ | ◎ | ○ | ◎ | ○ |
| | Thermal conductivity W/mK | 8.6 | 7.7 | 9.8 | 8.3 | 7.8 |
| | Thermal conductivity evaluation | ◎ | Δ | ◎ | ○ | Δ |

| | Raw materials | Comparative Example 1 | Comparative Example 2 | Comparative Example 3 | Comparative Example 4 |
|---|---|---|---|---|---|
| (A-1) | Indefinite-shaped aluminum nitride particles having average particle diameter of 80 μm | | | | |
| | Indefinite-shaped aluminum nitride particles having average particle diameter of 60 μm | 44.52 | 17.81 | | |
| (A') | Spherical aluminum nitride particles having average particle diameter of 80 μm | | | | 44.52 |
| | Spherical aluminum nitride particles having average particle diameter of 60 μm | | | 44.52 | |
| (A-2) | Indefinite-shaped aluminum nitride particles having average particle diameter of 30 μm (oil absorption: 41 g/100 g) | | | | |
| | Round aluminum nitride particles having average particle diameter of 20 μm (oil absorption: 19 g/100 g) | | 26.71 | | |

TABLE 1-continued

|   | | | | | |
|---|---|---|---|---|---|
| | Indefinite-shaped aluminum nitride particles having average particle diameter of 20 μm (oil absorption: 30 g/100 g) | | | | |
| (A-3a) | Polyhedral alumina particles having average particle diameter of 5.0 μm | 31.06 | 31.06 | 31.06 | 31.06 |
| (A-3b) | Polyhedral alumina particles having average particle diameter of 0.4 μm | 18.12 | 18.12 | 18.12 | 18.12 |
| (B-1) | Trialkoxy group-containing polyorganosiloxane | 1.50 | 1.50 | 1.50 | 1.50 |
| (C) | Dimethylpolysiloxane having both-ends blocked by vinyl groups: $M^{vi}D_{70}M^{vi}$ (viscosity: 130 mPa·s) | 0.69 | 0.69 | 0.69 | 0.69 |
| | Dimethylpolysiloxane having one-end blocked by vinyl groups: $MD_{30}M^{vi}$ (viscosity: 25 mPa·s) | 3.48 | 3.48 | 3.48 | 3.48 |
| (D) | Polyorganohydrogensiloxane: $M^H D_8^H D_{42} M^H$ (viscosity: 45 mPa·s) | 0.63 | 0.63 | 0.63 | 0.63 |
| (E) | Platinum-vinyl tetramer complex (2% platinum) | 0.025 | 0.025 | 0.025 | 0.025 |
| (E-2) | 1-Ethynyl-1-cyclohexanol | 0.003 | 0.003 | 0.003 | 0.003 |
| | Total | 100.0 | 100.0 | 100.0 | 100.0 |
| | Content (%) of component (A) | 93.7% | 93.7% | 93.7% | 93.7% |
| | Content (%) of components (A-1) and (A-2) based on the total mass of component (A) | 47.5% | 47.5% | 47.5% | 47.5% |
| | Component (A-1):component (A-2) | 100:0 | 40:60 | 100:0 | 100:0 |
| | Flow rate (g/min) | 18 | 90 | 45 | 49 |
| | Dischargeability evaluation | X | ◉ | ○ | ○ |
| | Thermal conductivity W/mK | 8.7 | 6.9 | 7.1 | 6.9 |
| | Thermal conductivity evaluation | ◉ | X | X | X |

From the comparison of Examples 1 to 5 with Comparative Examples 1 to 4, excellent dispensability and high thermal conductive properties were achieved by the thermally conductive polysiloxane compositions of Examples 1 to 5 in which the thermally conductive filler as the component (A) comprised, based on the total mass of the component (A), 20 to 100 mass % of (A-1) round, indefinite-shaped or polyhedral aluminum nitride particles having an average particle diameter of not less than 50 μm and not more than 150 μm and (A-2) round, indefinite-shaped or polyhedral aluminum nitride particles having an average particle diameter of not less than 10 μm and less than 50 μm, and the content ratio of the component (A-1) to the component (A-2) on a mass basis was 50:50 to 95:5.

In contrast, the composition of Comparative Example 1 in which the component (A) did not include the component (A-2) was inferior in dispensability. The composition of Comparative Example 2 in which the content ratio of the component (A-1) to the component (A-2) on a mass basis was smaller than 50:50 was inferior in thermal conductive properties. The compositions of Comparative Examples 3 and 4 in which the component (A-1) was replaced by spherical aluminum nitride particles having a similar particle diameter were inferior in thermal conductive properties.

The comparison between Examples 1 and 2 shows that Example 1 in which the content ratio of the component (A-1) to the component (A-2) on a mass basis was 90:10 resulted in high thermal conductivity, and Example 2 in which the content ratio was 60:40 attained high dispensability.

From the comparison of Examples 2, 4 and 5, the compositions in Examples 2 and 4, in which the oil absorption of the component (A-2) was 19 g/100 g, advantageously achieved high dispensability, as compared to Example 5 in which the oil absorption of the component (A-2) was 30 g/100 g.

From the comparison between Examples 2 and 4, the composition in Example 4, in which indefinite-shaped aluminum nitride particles having an average particle diameter of 80 μm were used as the component (A-1), exhibited excellent thermal conductive properties and excellent dispensability, as compared to Example 2 in which indefinite-shaped aluminum nitride particles having an average particle diameter of 60 μm were used.

Example 6

The components (A) and (B) shown in Table 2 were placed into a planetary mixer (manufactured by DALTON Corporation) and were mixed together by stirring at room temperature for 1 hour and further at 120° C. for 1 hour. The resultant mixture was cooled to 25° C. to obtain a grease-type thermally conductive polysiloxane composition. The flow rate of the composition thus obtained was measured, and the dispensability was evaluated. The results are shown in Table 2.

The thermal conductivity of the grease-type thermally conductive polysiloxane composition of Example 6 was measured with a thickness of 6 mm. The results are shown in Table 2.

TABLE 2

| | Raw materials | Example 6 |
|---|---|---|
| (A-1) | Indefinite-shaped aluminum particles having average particle diameter of 60 μm | 35.62 |
| (A-2) | Round aluminum nitride particles having average particle diameter of 20 μm (oil absorption 19 g/100 g) | 12.00 |
| (A-3a) | Polyhedral alumina particles having average particle diameter of 5.0 μm | 27.96 |
| (A-3b) | Polyhedral alumina particles having average particle diameter of 0.4 μm | 18.12 |

TABLE 2-continued

| | Raw materials | Example 6 |
|---|---|---|
| (B-1) | Trialkoxy group-containing polyorganosiloxane | 1.50 |
| (B-5) | Dimethylpolysiloxane having both-ends blocked by trimethylsilyl groups: $MD_{40}M$(viscosity: 30 mPa · s) | 4.80 |
| | Total | 100.0 |
| | Content (%) of component (A) | 93.7% |
| | Content (%) of components (A-1) and (A-2) based on the total mass of component (A) | 50.8% |
| | Component (A-1):component (A-2) | 75:25 |
| | Flow rate (g/min) | 49.0 |
| | Dischargeability evaluation | ○ |
| | Thermal conductivity W/mK | 8.2 |
| | Thermal conductivity evaluation | ○ |

Example 7

The components (A) and (B) shown in Table 3 were placed into a planetary mixer (manufactured by DALTON Corporation) and were mixed together by stirring at room temperature for 1 hour and further at 120° C. for 1 hour. The resultant mixture was cooled to 25° C. Thereafter, the component (F) was added to and mixed with the resultant mixture to give a condensation reaction-type thermally conductive polysiloxane composition. The flow rate of the composition thus obtained was measured, and the dispensability was evaluated. The results are shown in Table 3.

The condensation reaction-type thermally conductive polysiloxane composition of Example 7 was loaded into a mold having a thickness of 6 mm and was allowed to stand at 23° C. and 50% RH for 14 days without closing the mold with a lid. A cured product of the condensation reaction-type thermally conductive polysiloxane composition was thus obtained. The thermal conductivity of the cured product thus obtained was measured. The results are shown in Table 3.

TABLE 3

| | Raw materials | Example 7 |
|---|---|---|
| (A-1) | Indefinite-shaped aluminum nitride particles having average particle diameter of 80 μm | 35.89 |
| (A-2) | Round aluminum nitride particles having average particle diameter of 20 μm (oil absorption: 19 g/100 g) | 12.00 |
| (A-3a) | Polyhedral alumina particles having average particle diameter of 5.0 μm | 28.27 |
| (A-3b) | Polyhedral alumina particles having average diameter of 0.4 μm | 18.12 |
| (B-1) | Trialkoxy group-containing polyorganosiloxane | 4.38 |
| (B-2) | Methyltrimethyoxysilane | 0.50 |
| (B-4) | Dimethylpolysiloxane having both-ends blocked by methyldimethoxy groups (viscosity: 30 mPa · s) | 0.34 |
| (F) | Diisopropyl-bis(ethyl acetoacetate)titanium | 0.50 |
| | Total | 100.0 |
| | Content (%) of component (A) | 94.3% |
| | Content (%) of components (A-1) and (A-2) based on the total mass of component (A) | 50.8% |
| | Component (A-1):component (A-2) | 75:25 |
| | Flow rate (g/min) | 22 |
| | Dischargeability evaluation | Δ |
| | Thermal conductivity W/mK | 10.1 |
| | Thermal conductivity evaluation | ◎ |

INDUSTRIAL APPLICABILITY

The thermally conductive polysiloxane compositions of the present invention can be used as heat dissipation materials for various devices having heat-generating members, for example, electronic devices such as personal computers.

The invention claimed is:

1. A thermally conductive polysiloxane composition containing (A) a thermally conductive filler, and (B) at least one member selected from the group consisting of an alkoxysilyl group-containing compound and a dimethylpolysiloxane,
wherein the component (A) comprises, based on the total mass of the component (A):
20 to 60 mass % of (A-1) indefinite-shaped aluminum nitride particles having an average particle diameter of not less than 50 μm and not more than 150 μm,
2 to 25 mass % of (A-2) round, indefinite-shaped, or polyhedral aluminum nitride particles having an average particle diameter of not less than 13 μm and not more than 35 μm,
20 to 35 mass % of (A-3a) inorganic particles having an average particle diameter of not less than 1 μm and less than 10 μm, and
10 to 25 mass % of (A-3b) inorganic particles having an average particle diameter of not less than 0.15 μm and not more than 0.9 μm,
wherein the content ratio of the component (A-1) to the component (A-2) on a mass basis is 50:50 to 95:5, and
wherein the total of the components (A-1), (A-2), (A-3a), and (A-3b) represents 80 to 100 mass % of the total mass of the component (A).

2. The thermally conductive polysiloxane composition according to claim 1, wherein the inorganic particles of the components (A-3a) and (A-3b) are at least one member selected from the group consisting of silicon nitride particles, aluminum nitride particles and alumina particles, respectively.

3. The thermally conductive polysiloxane composition according to claim 1, further comprising (C) a polyorganosiloxane containing one or more aliphatic unsaturated groups per molecule, (D) a polyorganohydrogensiloxane having two or more hydrogen atoms bonded to silicon atoms per molecule, and a (E) platinum catalyst.

4. The thermally conductive polysiloxane composition according to claim 2, further comprising (C) a polyorganosiloxane containing one or more aliphatic unsaturated groups per molecule, (D) a polyorganohydrogensiloxane having two or more hydrogen atoms bonded to silicon atoms per molecule, and (E) a platinum catalyst.

5. The thermally conductive polysiloxane composition according to claim 1, wherein the component (A) is 20 to 42 mass % of the component (A-1) based on the total mass of the component (A).

6. The thermally conductive polysiloxane composition according to claim 1, wherein the component (A) is 25 to 35 mass of the component (A-3a) based on the total mass of the component (A).

7. The thermally conductive polysiloxane composition according to claim 1, wherein the component (A-2) has an oil absorption of 5 to 40 g/100 g as measured by a boiled linseed oil method in accordance with JIS K5101-13-2.

8. The thermally conductive polysiloxane composition according to claim 1, wherein the component (B) comprises the alkoxysilyl group-containing compound, and the composition further comprises (F) a condensation catalyst.

9. A heat dissipation material comprising the thermally conductive polysiloxane composition according to claim 1.

* * * * *